United States Patent
Wang et al.

(10) Patent No.: US 6,417,090 B1
(45) Date of Patent: Jul. 9, 2002

(54) DAMASCENE ARRANGEMENT FOR METAL INTERCONNECTION USING LOW K DIELECTRIC CONSTANT MATERIALS FOR ETCH STOP LAYER

(75) Inventors: Fei Wang, San Jose; Lu You, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/225,008

(22) Filed: Jan. 4, 1999

(51) Int. Cl.[7] .......................................... H01L 21/4763
(52) U.S. Cl. ........................ 438/622; 438/672; 438/710
(58) Field of Search ................................. 438/710, 725, 438/738, 709, 672, 673, 675, 622, 633, 634, 637

(56) References Cited

U.S. PATENT DOCUMENTS

| | | | |
|---|---|---|---|
| 5,354,712 A | | 10/1994 | Ho et al. |
| 5,565,384 A | * | 10/1996 | Havemann .................. 438/702 |
| 5,693,563 A | | 12/1997 | Teong |
| 6,020,269 A | * | 2/2000 | Wang et al. ................ 438/717 |
| 6,114,250 A | * | 9/2000 | Ellingboe et al. ........... 438/709 |
| 6,245,663 B1 | * | 6/2001 | Zhao et al. ................. 438/622 |

* cited by examiner

Primary Examiner—Olik Chaudhuri
Assistant Examiner—Ginette Peralta

(57) ABSTRACT

A method of forming a damascene structure in a semiconductor device arrangement uses a low k dielectric material in an etch stop layer that overlays a metal interconnect layer. The etch stop layer protects the metal interconnect layer, made of copper, for example, during the etching of a dielectric layer that overlays the etch stop layer. Following the etching of the dielectric layer, which stops on the etch stop layer, the etch stop layer is then etched with a chemistry that does not damage the underlying copper in the metal interconnect layer. The lower dielectric constant material employed in the etch stop layer reduces the overall dielectric constant of the film, thereby improving the operating performance of the chip.

8 Claims, 3 Drawing Sheets

DAMASCENE ARRANGEMENT FOR METAL INTERCONNECTION USING LOW K DIELECTRIC CONSTANT MATERIALS FOR ETCH STOP LAYER

FIELD OF THE INVENTION

The present invention relates to the formation of metal interconnection layers during the manufacture of semiconductor devices, and more particularly to the formation of a damascene structure in a metal interconnect region.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising 5 or more levels of metalization are becoming more prevalent as device geometries shrink to submicron levels.

A conductive plug filling a via hole is typically formed by depositing a dielectric interlayer on a conductive layer comprising at least one conductive pattern, forming an opening in the dielectric interlayer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit If the interconnection node is routed over a considerable distance, e.g., hundreds of microns or more as in sub-micron technologies, the interconnection capacitance limits the circuit node capacitance loading, and, hence, the circuit speed. As integration density increases and feature size decreases in accordance with submicron design rules, e.g., a design rule of about 0.18µ and below, the rejection rate due to integrated circuit speed delays severely limits production throughput and significantly increases manufacturing costs.

In prior technologies, aluminum was used in very large scale integration interconnect metalizations. Copper and copper alloys have received considerable attention as a candidate for replacing aluminum in these metalizations. Copper has a lower resistivity than aluminum and improved electrical properties vis-à-vis tungsten, making copper a desirable metal for use as a conductive plug as well as conductive wiring.

In the formation of a damascene structure, which is used to connect a conductive element to a previously formed metal layer, etching is performed through an insulating layer to create the desired feature, such as a single damascene or dual damascene structure. It is desirable to avoid etching of the underlying metal layer during etching of the overlying dielectric layer. The accidental etching of the metal layer is prevented by the use of an etch stop layer between the metal layer and the dielectric layer. During the etching of the dielectric layer, an etchant recipe is used that exhibits a high selectivity to the dielectric layer, so that the etching essentially stops at the etch stop layer. A second etchant process is performed to remove the etch stop layer in the region within the feature defined by the etching of the dielectric layer. This removes the etch stop layer over the metal layer and allows conductive material deposited in the feature in the dielectric layer to make electrical contact with the metal layer.

U.S. Pat. Nos. 5,693,563 and 5,354,712 describe damascene processes that include the use of copper. An etch stop for a copper damascene process is described in U.S. Pat. No. 5,693,563. The etch stop material that is used, however, as a relatively higher dielectric constant. Since the bulk of the etch stop layer is not removed, as it lies below the dielectric layer, the etch stop layer contributes to a higher overall dielectric value for the total film. This higher dielectric value has an adverse effect on the performance of the device that is ultimately manufactured.

There is a need for a method and arrangement that provides a film with a lower overall dielectric constant value that will exhibit improved overall performance, yet still provides the functionality of an etch stop layer in single damascene and dual damascene manufacturing processes.

SUMMARY OF THE INVENTION

These and other needs are met by the present invention which provides a method of forming a damascene structure in a semiconductor device arrangement. The method includes forming an etch stop layer on a metal interconnect layer, where the etch stop layer is composed of a low k dielectric material. A dielectric layer is then formed on the etch stop layer. A feature is etched through the dielectric layer, stopping on the etch stop layer using a first etch recipe. The etch stop layer is then etched through, using a second etch recipe, to enlarge the feature. The etching of the etch stop layer stops on the metal interconnect layer. The feature is then filled with conductive material that contacts the metal interconnect layer. In certain embodiments of the invention, the metal interconnect layer comprises copper, and the etch stop layer comprises benzocyclobutene (BCB).

The earlier stated needs are met by another aspect of the present invention which provides an interconnect arrangement for semiconductor devices comprising a metal interconnect layer and an etch stop layer on the metal interconnect layer. The etch stop layer is composed of a low k dielectric material. The dielectric layer is provided on the etch stop layer. An opening extends through the dielectric layer and the etch stop layer to the metal interconnect layer. Conductive material fills this opening and is in electrically conductive contact with the metal interconnect layer. In certain embodiments of the invention, the metal interconnect layer comprises copper.

The use of an etch stop layer that is composed of low k dielectric material lowers the overall dielectric value of the entire film. This has the advantage of improving the operating performance of the chip. Another important advantage of the use of certain low k materials, such as BCB, in the present invention is the ability of these materials to act as a copper diffusion barrier.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

DETAILED DESCRIPTION OF THE INVENTION

The present invention solves problems associated with the use of an etch stop layer having a relatively high dielectric constant. Specifically, the present invention lowers the overall dielectric constant value of the film by employing an etch stop layer that is composed of a low k dielectric material during a single damascene or dual damascene formation process.

Figure 1A:
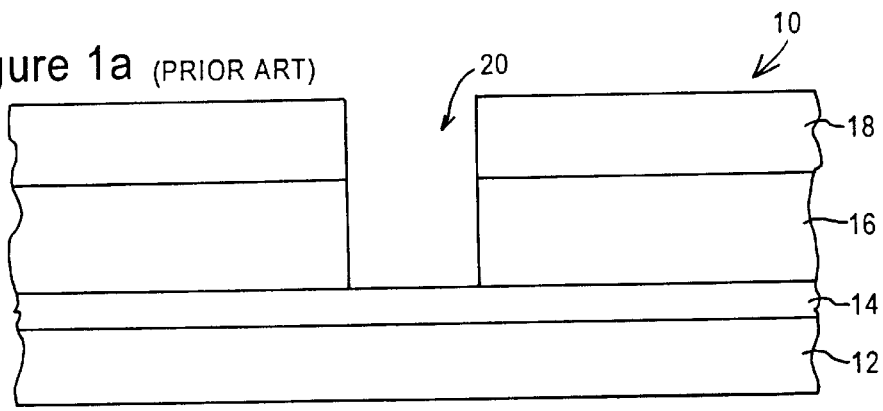
FIG. 1A is a cross-section of a metal interconnect portion of a semiconductor wafer processed in accordance with the prior art.

FIG. 1A depicts a cross-section of a metal interconnect portion of a chip constructed in accordance with the prior art. At this stage of processing, a metal layer 12 has been formed, and another conductive feature is to be formed that electrically conductively contacts the metal layer 12. The metal can be copper, for example.

An etch stop layer 14 has been deposited over the metal layer 12. Typical etch stop layers are comprised of a nitride, such as silicon nitride, for example. The etch stop layer 14 serves to protect the metal layer 12 during the etching of other layers deposited on the etch stop layer 14.

Figure 1B:
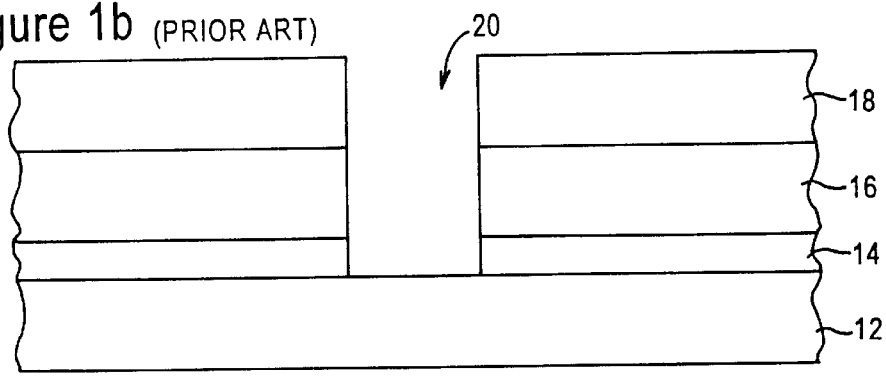
FIG. 1B is a cross-section of the metal interconnect portion of FIG. 1A after the etch stop layer has been removed.

A dielectric layer 16 is deposited over the etch stop layer 14. Dielectric layer 16 may be composed of oxide, for example. A photoresist layer 18 has been formed on the dielectric layer 16 and patterned with the desired feature that is to be formed in the dielectric layer 16 and etch stop layer 14. A first etching step, performed in accordance with a first etch recipe, produces a feature 20 in the dielectric layer 16. The first etchant recipe exhibits a selectivity such that the dielectric layer 16 is etched without any substantial etching of the etch stop layer 14. Thus, there is no concern about unintentional over-etching into the metal layer 12, by using the etch stop layer 14. In FIG. 1B, the portion of the etch stop layer 14 that is exposed by the first etch step is etched away using a second etch recipe specifically designed for etching the material in the etch stop layer 14. This etching is precisely controlled and does not substantially etch the metal in the metal layer 12.

Figure 1C:
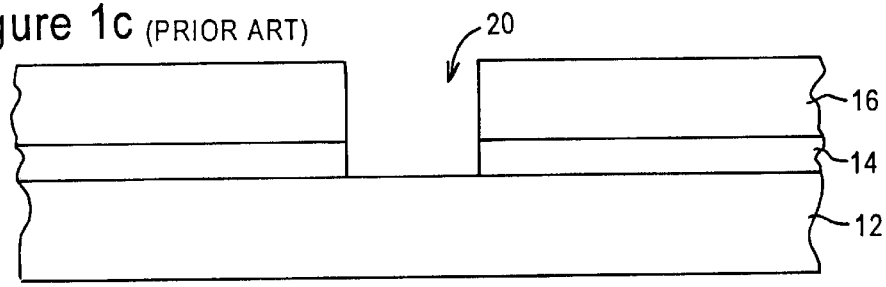
FIG. 1C is a cross-section of the metal interconnect portion of FIG. 1B following removal of the resist that defines the feature.

FIG. 1C depicts the metal interconnect portion of FIG. 1B after the photoresist 18 is removed, by oxygen ashing or a chemical solvent, for example.

Figure 1D:
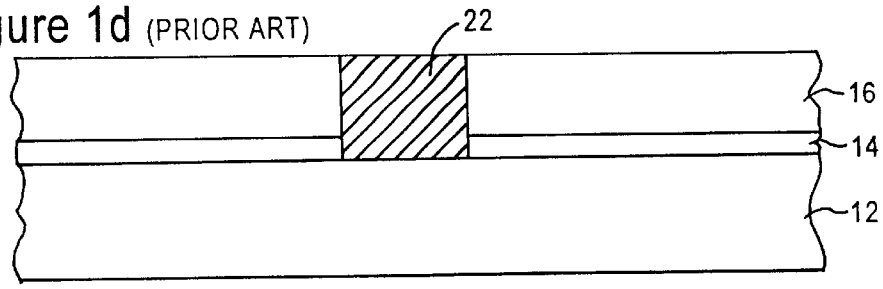
FIG. 1D is a cross-section of the portion of FIG. 1C following the depositing of metal within the defined feature.

FIG. 1D depicts the filling of the feature 20 with a conductive material 22, such as copper. This depiction is schematic only, as a barrier layer that is typically provided prior to the deposition of copper (to prevent copper diffusion) is not depicted.

The etch stop layer 14 remains in bulk in the final product, since the etch stop layer 14 is substantially completely covered by the dielectric layer 16 and is never removed. Hence, the dielectric constant of the etch stop layer 14 will have an effect on the overall dielectric constant value of the film. Silicon nitride, commonly used as an etch stop material, exhibits a relatively high dielectric constant value. The performance of the chip will therefore not be as optimal as can be achieved by reduction in the overall dielectric constant value.

Figure 2:
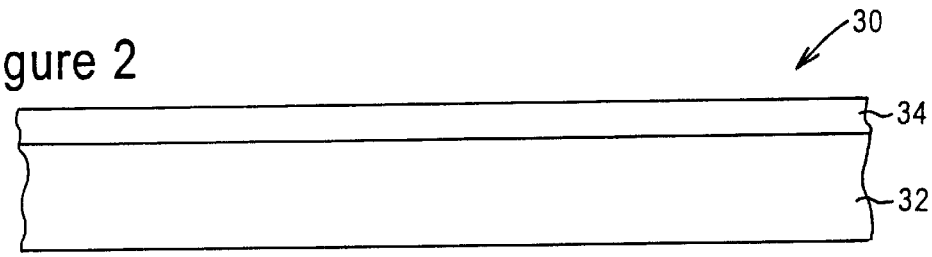
FIG. 2 is a cross-section of a metal interconnect portion during a phase of the manufacturing thereof, following the formation of a low k dielectric material layer as an etch stop layer on a metal layer in accordance with embodiments of the present invention.

The present invention employs a low k dielectric material as the etch stop material in the metal interconnect portion of the chip. FIG. 2 is a cross-section depicting the metal interconnect portion during its formation. The metal interconnect portion 30 has a metal layer 32, made of copper, for example. The underlying metal layer 32 is covered by an etch stop layer 34. In preferred embodiments of the present invention, the etch stop layer 34 comprises a low k dielectric material, such as benzocyclobutene (BCB), hydrogen silsesquioxane (HSQ), and FLARE and SILK, which are both commercially available low k dielectric materials. The low k dielectric layer 34 may be spun on, for example. The thickness of the etch stop layer 34 may be between about 400 Å and about 1000 Å, for example. This provides a suitable thickness to adequately protect the metal layer 32 during the etching of a dielectric layer overlying, the etch stop layer 34 during a first etching step. It is noted that the above-listed low k dielectric materials are exemplary only, as other low k dielectric materials may be used in the etch stop layer 34 without departing from the spirit or scope of the present invention.

Dielectric layer 36 is deposited on the etch stop layer 34. The dielectric layer 36 may comprise material that has a relatively higher dielectric constant, such as k=4. For example, the dielectric material in dielectric layer 36 may be an oxide. The dielectric material is deposited to varying thicknesses, depending on the application required. For purposes of example, assume that the dielectric layer 36 is deposited to a thickness of between about 4000 and about 8000 Å.

Figure 3:
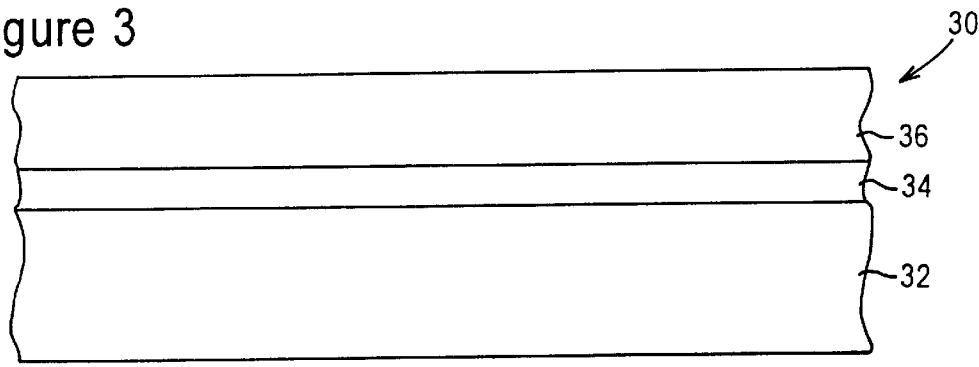
FIG. 3 is a cross-section of the portion of FIG. 2, after a dielectric layer is deposited on the etch stop layer.
Figure 4:
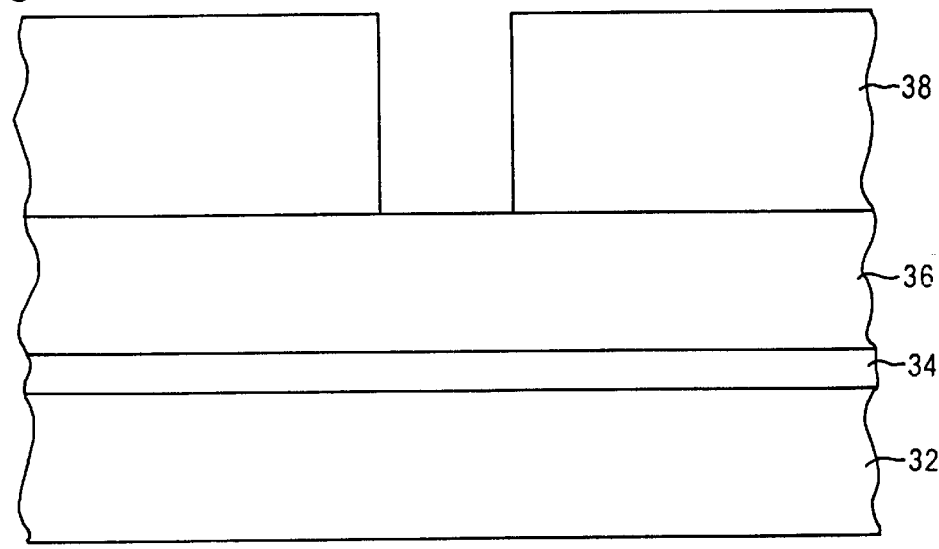
FIG. 4 is a cross-section of the portion of FIG. 3, following the positioning and patterning of a photoresist layer on the dielectric layer to define a feature to be etched in the dielectric layer and the etch stop layer, in accordance with embodiments of the present invention.

FIG. 4 depicts the metal interconnect portion of FIG. 3 following deposition and patterning of a photoresist layer 38. Patterning photoresist layer 38 defines the feature that will be etched into the dielectric layer 36 and through the etch stop layer 34 to the metal layer 32. Conventional techniques of deposition and patterning of the photoresist 38 are employed.

Figure 5:
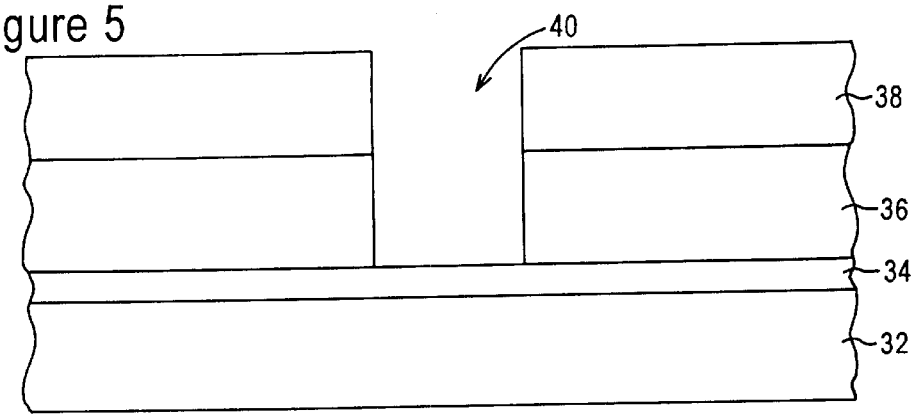
FIG. 5 is a cross-section of the portion of FIG. 4, after etching through the dielectric layer in accordance with the pattern in the photoresist layer, in accordance with embodiments of the present invention.

FIG. 5 is a cross-section of the metal interconnect portion of FIG. 4 following the etching of the dielectric layer 36. The desired feature 40, such as a trench or via, is created by the etching of the dielectric layer 36. A first etchant recipe is employed that is selective to the material in the etch stop layer 40. This allows the dielectric layer 36 to be etched, while the etching stops at the etch stop layer 34. Assuming that the material in the dielectric material is an oxide, for example, a suitable etch recipe that will etch the oxide and stop on the etch stop layer 34 is $C_4F_8/Ar/O_2/CO$, or $C_4F_8/Ar$, or $C_4F_6$. Etch stop layer 34 has thereby protected the metal layer 32 from etching during this etching of the dielectric layer 36.

Figure 6:
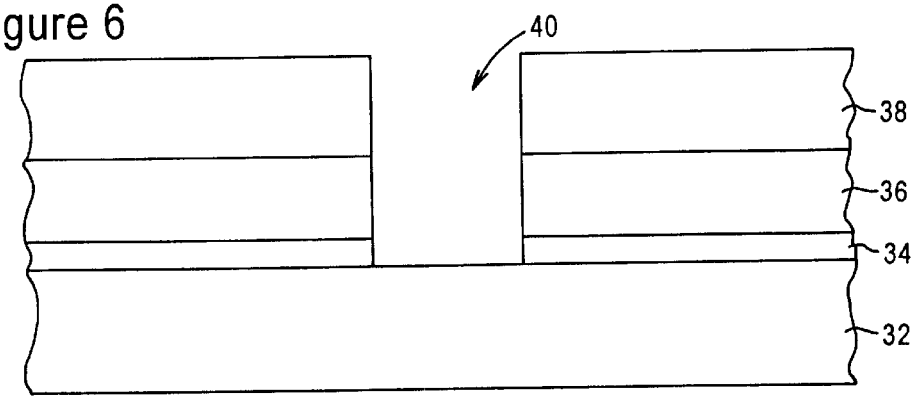
FIG. 6 is a cross-section of the portion of FIG. 5, following an etching through the etch stop layer, in accordance with certain embodiments of the present invention.
Figure 7:
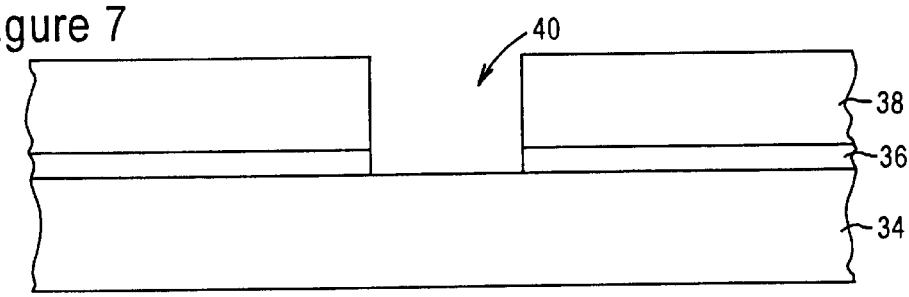
FIG. 7 is a cross-section of the portion of FIG. 6, following the removal of the photoresist layer in accordance with certain embodiments of the present invention, or as a cross-section of the portion of FIG. 5 following simultaneous removal of the photoresist layer and etching through the dielectric layer in accordance with certain other embodiments of the present invention.

A second etching is now performed, as depicted in FIG. 6, in order to remove the low k material in the etch stop layer 34 within the feature 40. This allows the feature 40 to extend to the metal layer 32 so that a subsequently formed conductive material may electrically contact the underlying metal layer 32. The low k material, which may-be benzocyclobutene, for example, is removed with a non-oxide based plasma, containing nitrogen, hydrogen, argon, for example. The photoresist is then removed, depicted in FIG. 7, by a wet chemical process or a dry process. An example of a suitable etchant chemistry to remove the photoresist is $N_2/H_2$ under the following process conditions. The power is between 500 and 1500 Watts; pressure is between about 30 and about 50 mTorr; the $N_2$ is supplied at between about 100 and about 500 sccm and the $H_2$ is supplied at between about 100 and 500 sccm. The substrate temperature is between about −30C. and +30C. Whichever etchant chemistries are chosen must avoid attacking the etch stop layer and the copper conductive surface.

Figure 8:
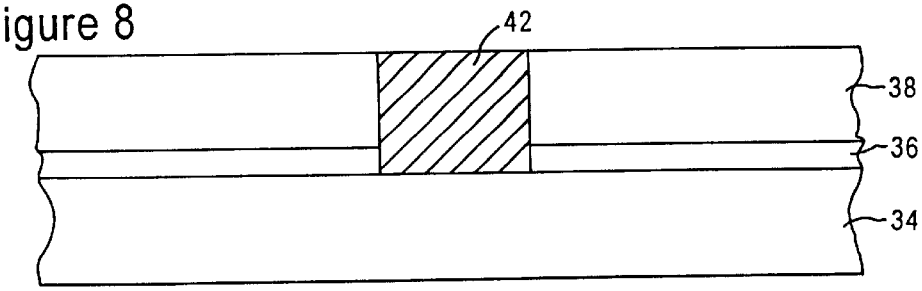
FIG. 8 is a cross-section of the portion of FIG. 7 after the feature is filled with a conductive material, in accordance with certain embodiments of the present invention.

Conductive material, such as copper, is then deposited (by electroless deposition, for example) to form the desired conductive feature 42, as depicted in FIG. 8. As noted earlier, a barrier layer is not depicted for purposes of illustration, but may be included prior to the deposition of the conductive material.

In certain embodiments of the present invention, the photoresist layer 38 and the portion of the etch stop layer 34 in the feature 40 that is to removed, may be simultaneously removed by an oxygen based plasma. In these embodiments, the structure in FIG. 7 follows that of FIG. 5, so that the structure in FIG. 6 is not produced during the manufacturing process. These embodiments have the advantage of combining the etch stop removal step and the resist removal step into a single step, thereby simplifying the manufacturing process.

The present invention allows the removal of the low k material in the etch stop layer 34 without damaging copper by using a gas chemistry of $N_2/H_2/C_xF_yH_z$.

The etch stop layer 34 that is used to protect the copper in the metal layer 32, or other metal in the metal layer 32, remains in place after the formation of the conductive feature 42, as depicted in FIG. 8. Since the material in the etch stop layer 34 is a low k dielectric material, the overall dielectric value of the film is reduced thereby improving the performance of the chip.

Although the present invention has been described and illustrated in detail, it is to be early understood that the same is by way of illustration and example only and is not to be taken by way of limitation, the spirit and scope of the present invention being limited only by the terms of the appended claims.

What is claimed is:

1. A method of forming a damascene structure in a semiconductor device arrangement, comprising the steps of:
    forming an etch stop layer on a metal interconnect layer, the etch stop layer composed of a low k dielectric material;
    forming a dielectric layer on the etch stop layer;
    forming a resist layer on the dielectric layer and patterning the resist layer to define the feature to be etched through the dielectric layer;
    etching a feature through the dielectric layer and stopping on the etch stop layer using a first etch recipe;
    simultaneously etching through the etch stop layer to enlarge the feature and stopping on the metal interconnect layer and removing the resist layer by exposing the resist layer and the etch stop layer to an oxygen plasma; and
    filling the feature with conductive material that contacts the metal interconnect layer.

2. The method of claim 1, wherein the metal interconnect layer comprises copper.

3. The method of claim 2, wherein the conductive material is copper.

4. The method of claim 2, wherein the dielectric layer comprises oxide.

5. A method of forming a damascene structure in a semiconductor device arrangement, comprising the steps of:
    forming an etch stop layer on a metal interconnect layer, wherein the etch stop layer comprises benzocyclobutene (BCB);
    forming a dielectric layer on the etch stop layer;
    etching a feature through the dielectric layer and stopping on the etch stop layer using a first etch recipe;

etching through the etch stop layer to enlarge the feature and stopping on the metal interconnect layer, wherein all of the etching through the dielectric layer and through the etch stop layer is performed with oxygen-free etchant chemistries; and filling the feature with conductive material that contacts the metal interconnect layer.

6. The method of claim 2, wherein the etch stop layer is between about 400 Å and about 1000 Å thick.

7. The method of claim 2, wherein the step of etching through the etch stop layer includes subjecting an exposed portion of the etch stop layer to a plasma that does not substantially react with the dielectric layer.

8. A method of forming a damascene structure in a semiconductor device arrangement comprising the steps of:

forming an etch stop layer on a metal interconnect layer, the etch stop layer composed of a low k dielectric material;

forming a dielectric layer on the etch stop layer;

etching a feature through the dielectric layer and stopping on the etch stop layer using a first etch recipe, wherein the first etch recipe includes at least one of $C_4F_8$/Ar and $C_4F_8/C_2F_6$;

etching through the etch stop layer to enlarge the feature and stopping on the metal interconnect layer, wherein all of the etching through the dielectric layer and through the etch stop layer is performed with oxygen-free etchant chemistries and the etch stop layer is etched through with a non-oxide based plasma containing nitrogen, hydrogen and argon; and filling the feature with conductive material that contacts the metal interconnect layer.

* * * * *